(12) United States Patent
Dobisz et al.

(10) Patent No.: US 6,778,364 B2
(45) Date of Patent: Aug. 17, 2004

(54) CURRENT-IN-PLANE MAGNETORESISTIVE SENSOR WITH LONGITUDINAL BIASING LAYER HAVING A NONMAGNETIC OXIDE CENTRAL REGION AND METHOD FOR FABRICATION OF THE SENSOR

(75) Inventors: Elizabeth A. Dobisz, San Jose, CA (US); Robert E. Fontana, Jr., San Jose, CA (US); James L. Nix, Gilroy, CA (US); Neil Smith, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 108 days.

(21) Appl. No.: 10/230,903

(22) Filed: Aug. 28, 2002

(65) Prior Publication Data

US 2004/0042131 A1 Mar. 4, 2004

(51) Int. Cl.[7] .................................................. G11B 5/39
(52) U.S. Cl. ................................................. 360/324.12
(58) Field of Search ........................ 360/324.1, 324.11, 360/324.12, 324.2

(56) References Cited

U.S. PATENT DOCUMENTS

| | | | | |
|---|---|---|---|---|
| 6,266,218 B1 | | 7/2001 | Carey et al. ............ | 360/324.12 |
| 6,501,627 B2 | * | 12/2002 | Noma et al. ............ | 360/324.12 |
| 6,538,860 B1 | * | 3/2003 | Kakihara et al. ...... | 360/324.12 |
| 6,633,466 B2 | * | 10/2003 | Sakaguci et al. ...... | 360/327.31 |
| 6,671,139 B2 | * | 12/2003 | Carey et al. ........... | 360/324.12 |
| 2002/0034055 A1 | * | 3/2002 | Seyama et al. ........ | 360/324.11 |
| 2002/0097540 A1 | * | 7/2002 | Hayashi et al. ........ | 360/324.12 |
| 2002/0131218 A1 | * | 9/2002 | Beach ..................... | 360/324.12 |
| 2002/0181173 A1 | * | 12/2002 | Nagai ..................... | 360/324.12 |
| 2003/0035256 A1 | * | 2/2003 | Hayashi et al. ........ | 360/324.12 |
| 2003/0156361 A1 | * | 8/2003 | Li et al. ................. | 360/324.12 |
| 2003/0179517 A1 | * | 9/2003 | Horng et al. .......... | 360/324.12 |

* cited by examiner

Primary Examiner—Jefferson Evans
(74) Attorney, Agent, or Firm—Thomas R. Berthold; Daniel E. Johnson

(57) ABSTRACT

A current-in-the-plane (CIP) giant magnetoresistive (GMR) spin valve sensor has its free layer magnetization stabilized by longitudinal biasing through the use of free layer end-region antiferromagnetic exchange coupling. An antiparallel coupling (APC) layer, such as Ru, is formed on the free layer and a ferromagnetic bias layer is formed on the APC layer. The bias layer is a continuous layer that extends across the entire width of the free layer. The central region of the bias layer is formed of nonmagnetic oxides of one or more of the elements making up the bias layer, with the bias layer end regions remaining ferromagnetic. The oxidized central region of the bias layer defines the central active trackwidth region of the underlying free layer. The ferromagnetic end regions of the bias layer are antiferromagnetically coupled across the APC layer to the corresponding underlying free layer end regions to provide the longitudinal biasing.

28 Claims, 9 Drawing Sheets

CURRENT-IN-PLANE MAGNETORESISTIVE SENSOR WITH LONGITUDINAL BIASING LAYER HAVING A NONMAGNETIC OXIDE CENTRAL REGION AND METHOD FOR FABRICATION OF THE SENSOR

TECHNICAL FIELD

This invention relates generally to current-in-the-plane (CIP) magnetoresistive sensors, such as giant magnetoresistive (GMR) sensors, and their fabrication. More particularly the invention relates to such a magnetoresistive sensor with a biasing layer for longitudinally biasing the magnetization of the ferromagnetic sensing layer.

BACKGROUND OF THE INVENTION

The most common CIP GMR sensor is a spin-valve structure with two metallic ferromagnetic layers separated by a very thin nonmagnetic conductive layer, wherein the electrical resistivity for the sensing current in the plane of the layers depends upon the relative orientation of the magnetizations in the two ferromagnetic layers. The GMR sensor has high magnetoresistance at room temperature with generally low noise, making it a primary sensor for use as a read head in high density hard disk drives.

IBM's U.S. Pat. No. 6,266,218 describes a GMR read head as shown in FIG. 1 (which is FIG. 7 of the '218 patent), wherein one of the ferromagnetic layers (the "reference" or "fixed" layer 76) has its magnetization fixed, such as by being pinned by exchange coupling with an adjacent antiferromagnetic layer 74, and the other ferromagnetic layer (the "free" layer 78) is free to rotate in the presence of an applied magnetic field in the range of interest of the read head. Interposed between the free layer 78 and fixed layer 76 is an electrically conductive nonmagnetic spacer layer 80, typically made of Cu. This read head also has a third ferromagnetic layer (the "bias" layer 87) that provides longitudinal biasing of the free layer 78 so that its magnetization in the sensing or active region 79 of the read head is stabilized in a single-domain state with predominantly longitudinal magnetization orientation. The width of the active region 79 determines the magnetic trackwidth ("TW") of the read head.

The sensor described in the '218 patent relies on longitudinal biasing or stabilization of the free layer end regions by antiferromagnetic exchange coupling with the bias layer 87. This requires the formation of the ferromagnetic bias layer 87 in close proximity to the end regions of the free layer 78, but spaced apart from the free layer by a thin nonmagnetic conductive layer 83 (such as Ru) which mediates a strong antiferromagnetic or antiparallel exchange coupling between the free layer end regions and the bias layer. The nonmagnetic conductive layer 83, also called the antiparallel coupling (APC) layer, is typically ruthenium (Ru) with a thickness in the range of 0.6 to 1.0 nm. To properly define the active region 79, the bias layer must be removed from the central active region 79 of the device. This presents a difficult problem in the fabrication of the sensor. If the bias layer is deposited first beneath the free layer (as shown in the "top" spin valve structure in FIG. 1 because the fixed layer is on top) and then patterned, the required magnetic properties of the subsequently deposited sensor layers will be unobtainable. If the bias layer is deposited last on top of the free layer (so as to form a "bottom" spin valve structure reversed from that of FIG. 1 with the fixed layer on the bottom) then it is necessary to pattern and remove the bias layer over the central active region 79, while preserving the desired ferromagnetic properties of the free layer in the active region 79. Generally, techniques for removal of the unwanted region of the bias layer, such as ion beam etching through a photoresist stencil, will not be sufficiently precise to remove the bias layer while leaving the free layer unaffected.

What is needed is a GMR sensor that provides the same type of free layer longitudinal bias stabilization through antiferromagnetic exchange coupling of the free layer end regions, but by a more reliable manufacturing process.

SUMMARY OF THE INVENTION

The invention is a CIP GMR spin valve sensor that has its free layer magnetization stabilized by longitudinal biasing through the use of free layer end-region antiferromagnetic exchange coupling. An APC layer, such as Ru, is formed on the free layer and a ferromagnetic bias layer is formed on the APC layer. The bias layer is a continuous layer that extends across the entire width of the free layer. However, the central region of the bias layer is formed of nonmagnetic oxides of one or more of the elements making up the bias with the bias layer end regions remaining ferromagnetic. The oxidized central region of the bias layer defines the central active trackwidth region of the device. The ferromagnetic end regions of the bias layer are antiferromagnetically coupled across the APC layer to the corresponding underlying free layer end regions to provide the longitudinal biasing.

For a fuller understanding of the nature and advantages of the present invention, reference should be made to the following detailed description taken together with the accompanying figures.

DETAILED DESCRIPTION OF THE INVENTION

Prior Art

Figure 1:
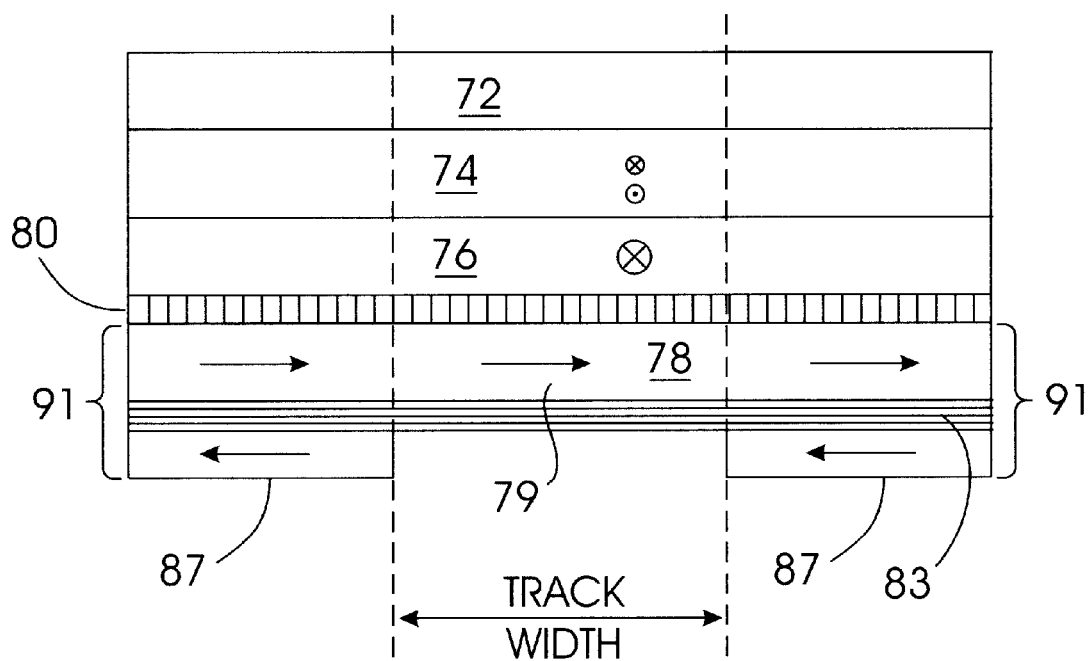
FIG. 1 shows a cross section view of the prior art GMR top spin valve sensor as shown and described in U.S. Pat. No. 6,266,218.
Figure 2:
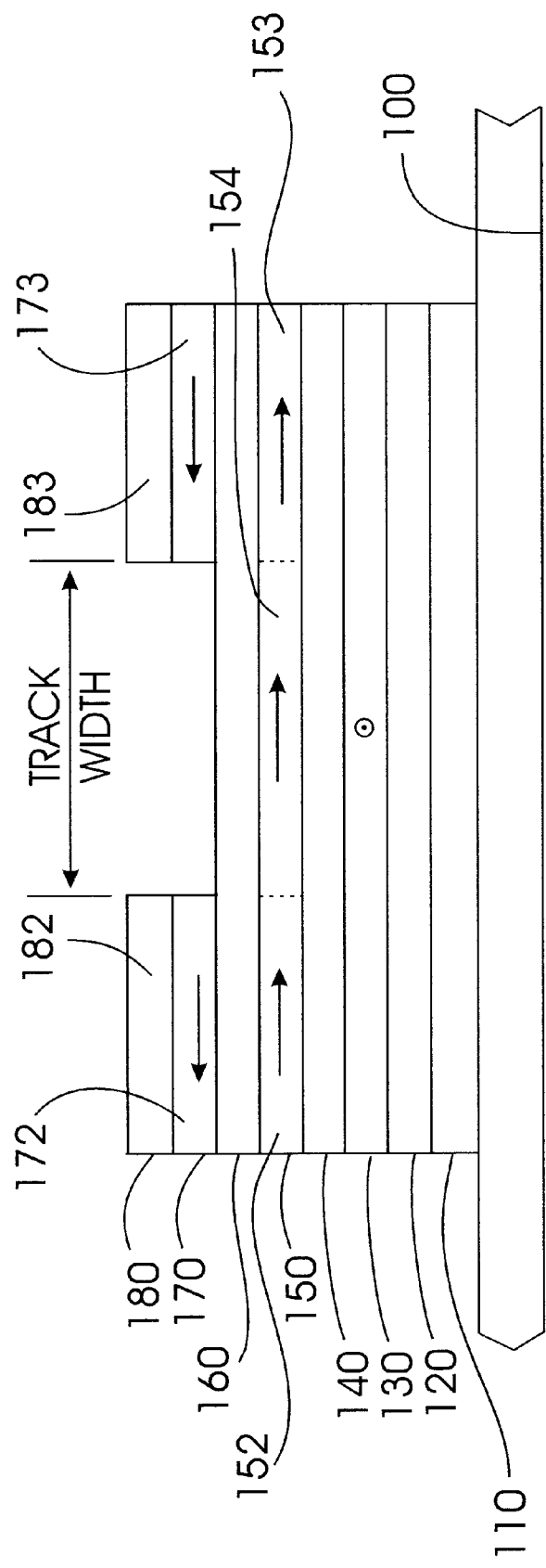
FIG. 2 shows a cross section view of a prior art GMR bottom spin valve sensor with longitudinal biasing.

The prior art GMR sensor will now be described in more detail. FIG. 2 is a cross sectional view of a "bottom" spin valve GMR sensor because the fixed layer is located on the bottom of the sensor, and is essentially the reverse structure of the "top" spin valve GMR sensor shown and described in FIG. 1. The sensor is formed on a substrate 100 and includes an underlayer 110, an antiferromagnetic layer 120, a pinned ferromagnetic fixed layer 130, a nonmagnetic conducting spacer layer (e.g., copper) 140, a free ferromagnetic layer 150, a nonmagnetic conductive APC layer 160, and localized end regions 172, 173 of a ferromagnetic bias layer 170 and end regions 182, 183 of a lead layer 180. The end regions of layers 170 and 180 are separated in lateral extent by the trackwidth distance TW. The free layer 150 has longitudinal biasing provided by the antiferromagnetically coupled end regions 152, 153 on either side of the central active trackwidth region 154. This is shown by the arrows, which represent the antiparallel alignment of the magnetizations in these regions, i.e., antiferromagnetically coupled regions 152, 172 and 153, 173, respectively.

There is intimate, atomic contact between antiferromagnetic layer 120 and fixed layer 130, such that exchange coupling with antiferromagnetic ordering is achieved between these two layers. The single fixed layer 130 can also be substituted with a well-known antiparallel-pinned (or AP-pinned) fixed layer comprising two ferromagnetic films separated by an APC film that allows the two ferromagnetic films to be antiferromagnetically coupled. The antiferromagetic layer 120 can become diminishingly thin. FIG. 2 also depicts the magnetic state of layer 130 as having its magnetization directed into the page. The spacer layer 140 separates the fixed layer 130 from the free layer 150. Sensing current directed into the leads and flowing through and across the layers 130, 140, and 150, is scattered at the interfaces of layers 130–140 and layers 140–150, as well as in the interior of layers 130 and 150. The scattering intensity is dependent upon the electron spin moment of the current carriers relative to that of the magnetization directions in the layers, which affects the electrical resistivity for the sensing current.

Layer 160 is a conductive metal layer that serves as the antiferromagnetic coupling (or APC) layer between the free layer 150 and the bias layer 170. The bias layer 170 is subsequently localized over the two end regions 172, 173 by removal of bias layer material in the central region where the normal magnetic sensing operation is intended. The remaining end regions 172, 173 of the bias layer 170 define the end regions 152, 153, respectively, of the underlying free layer 150. With the bias layer suitably removed, the magnetization of the free layer central active region 154 can readily rotate in response to torques induced by the incident magnetic fields from the recording disk. By contrast, torques from the incident magnetic fields applied to the end-regions are applied approximately equally to both the free and bias layers in these end regions because the layers are in extremely close proximity to each other. Because the magnetizations in the free and bias layers in the end regions are strongly antiparallel coupled, they can only rotate easily when rotating in opposite directions, so as to approximately maintain their antiparallel alignment. Thus magnetic fields applied at the end-regions do not significantly rotate the magnetization in the free layer central region 154 from its quiescent state.

In this manner, the active magnetic trackwidth region 154 of the free layer 150 (and the sensor as a whole) is defined by the patterning of the bias layer (and leads), despite that the free layer 150 is itself a single continuous layer between its active region 154 and end regions 152, 153. In a sensor with this type of longitudinal biasing, because the free layer can have a physical width substantially larger than its active magnetic sensing width, the fabrication/process problems of physically etching and magnetically stabilizing the end regions are eliminated.

The materials for sensors with the structure shown in FIG. 2 are well known, and representative ones will be described. The base stack comprises a stack of 150 Å PtMn/20 Å $Co_{90}Fe_{10}$/22 Å Cu/30 Å $Co_{90}Fe_{10}$/10 Å Ru/35 Å $Co_{90}Fe_{10}$ (layers 120, 130, 140, 150, 160, 170, respectively) deposited on a substrate. In addition to $Co_{90}Fe_{10}$, other compositions of CoFe and NiFe, e.g. permalloy ($Ni_{81}Fe_{19}$), and other alloys of one or more of Co, Fe and Ni are possible. In addition, bi-layers of CoFe and NiFe may be used for both the bias layer 170 and the free layer 150. Besides Ru, other materials for the APC layer 160 include Rh, Cr and Pd. Substrate 100 may be an aluminum oxide-titanium-carbide, silicon carbide, silicon or other ceramic material, coated with a dielectric material such as amorphous aluminum oxide.

A typical fabrication process for the sensor of FIG. 2 is described as follows. The underlayer 110 and antiferromagnetic PtMn layer 120 are sputter deposited on the substrate followed by in situ deposition of the CoFe fixed layer 130, Cu spacer layer 140, a free layer 150 consisting of NiFe or CoFe or an alloy or bilayer of NiFe and CoFe, Ru APC layer 160, and CoFe bias layer 170. Processing to form the active trackwidth region 154 is typically by physically removing the central region of the bias layer 170 through a photoresist mask with an aperture the size of the intended magnetic track width dimension, adjusted by appropriate process bias requirements. Existing art processes for physical removal of the bias layer 170, in the central region over 154, include ion milling or sputtering, reactive ion etching, and wet chemical etching. All of these processes require extremely difficult end-point control to assure that all of the bias layer material within the aperture is removed, while maintaining the complete free layer in tact without loss of thickness or degradation of its magnetic properties. Since the intermediate Ru APC layer 160 is only approximately 6–10 Å, determination and control of this required end-point will be problematic in a manufacturing operation, where variation in etch rate alone across a typical wafer diameter will exceed these constraints. In addition, if the end-point were to be controlled to the required accuracy, all of the ion processes described above would damage the underlying free layer. Wet chemical etching has the additional problem of being an isotropic process and will undercut the mask and substantially widen the track width by an uncontrollable amount.

The Invention

Figure 3:
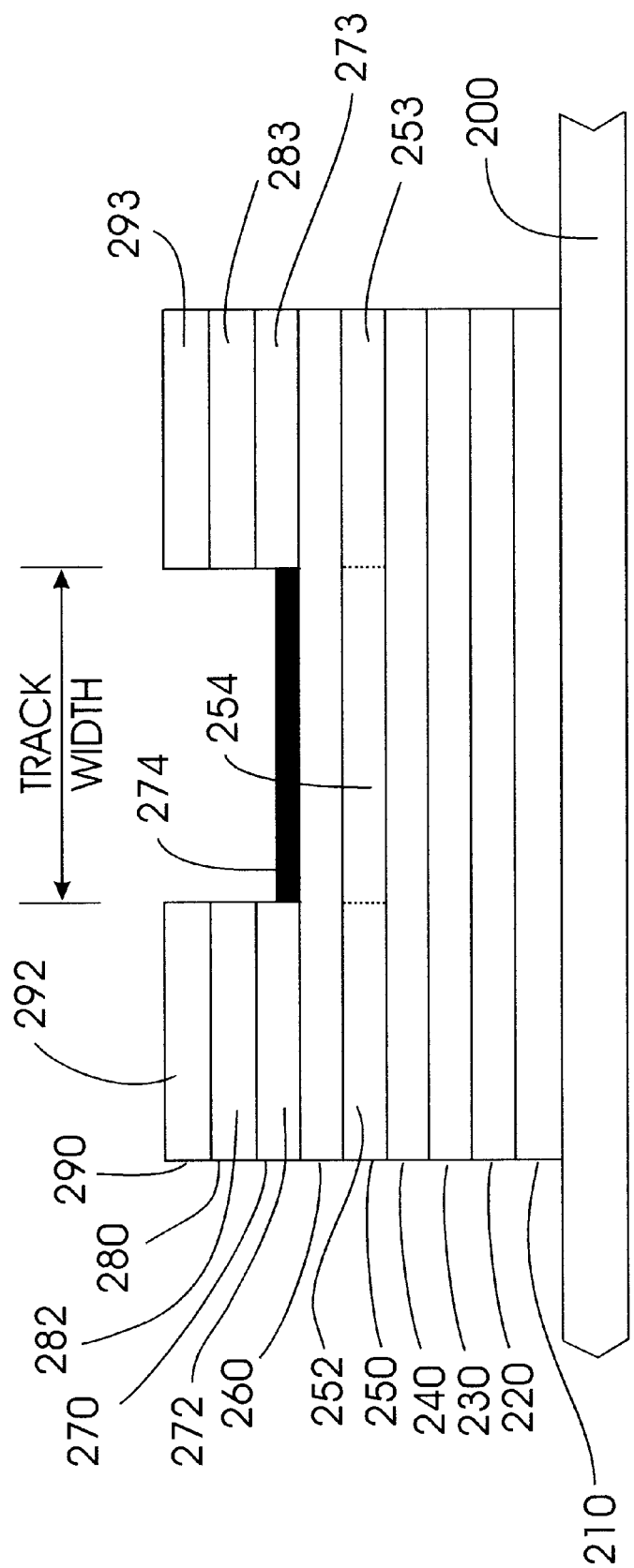
FIG. 3 shows a cross section view of the GMR spin valve sensor with an improved longitudinal bias structure according to the present invention.

The CIP GMR spin valve sensor of the present invention is shown in FIG. 3 in cross section view in the form of a spin-valve read head for a magnetic recording disk drive. FIG. 3 is essentially the read head sensor as it would be viewed from the disk with a trackwidth dimension TW that represents the sensing width for reading the data tracks on the disk. In this structure, the ferromagnetic bias layer 270 is now a continuous film with a central region 274 oxidized to render this localized region nonmagnetic and highly electrically resistive. As described for the prior art structure of FIG. 2, the bias layer 270 in the present invention may be formed of one or more alloys of Co, Fe and Ni, or a bilayer of CoFe and NiFe. As will be described, the use of oxidation allows for a more manufacturable process to form localized free layer end regions 252, 253 that are antiferromagnetically coupled across the APC layer 260 with corresponding bias layer end regions 272, 273.

The sensor is formed on a substrate 200 and includes a bottom underlayer 210, an antiferromagnetic layer 220, a fixed ferromagnetic layer 230, a conductive spacer layer 240, a free ferromagnetic layer 250, an APC layer 260, and a ferromagnetic bias layer 270. Over the central trackwidth (active) region 254 of the sensor, the ferromagnetic bias layer 270 is oxidized in a central region 274 to render the ferromagnetic bias layer in this region nonmagnetic and highly electrically resistive. The oxidation destroys the antiferromagnetic coupling between bias layer region 274 and free layer 250 in the central trackwidth region 254 so that the magnetization in the device active region 254 can detect or sense magnetic fields in this trackwidth region only. The sensor also has localized end regions 282, 283 of capping layer 280 and end regions 292, 293 of lead layer 290 with edges aligned to the outer edges of the oxidized region 274 of bias layer 270. The materials used for the various layers in the sensor of the present invention are those well-known in the art, as described previously for the prior art sensor on FIG. 1. The primary difference in materials is that the material in the bias layer central region 274 is one or more nonmagnetic oxides of one or more of the elements making up the bias layer before oxidation, typically Co, Fe and Ni.

Figure 4A:
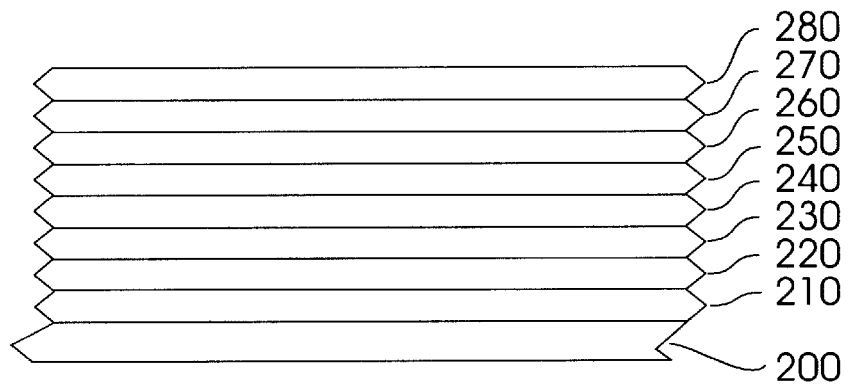
FIGS. 4a–4i are cross section views of the sensor of FIG. 3 at various stages in the fabrication process.
Figure 4B:
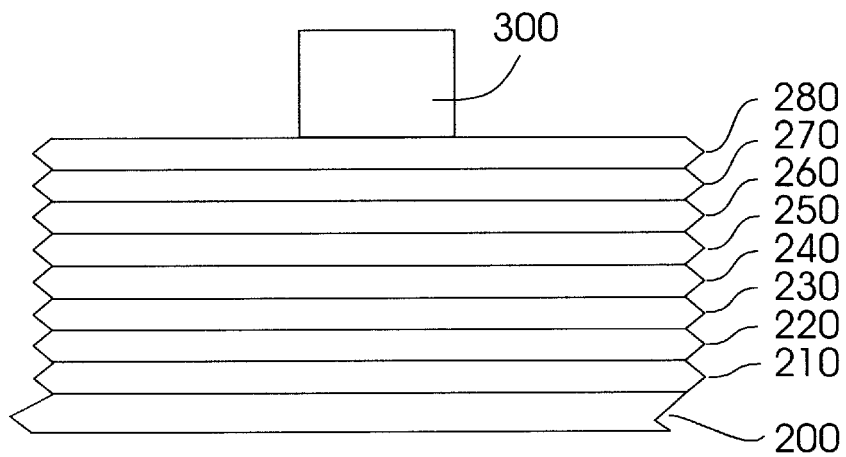
Figure 4C:
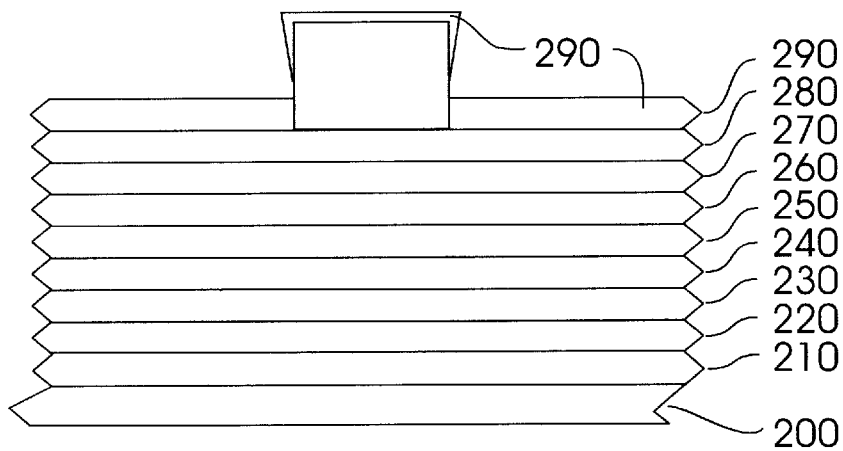
Figure 4D:
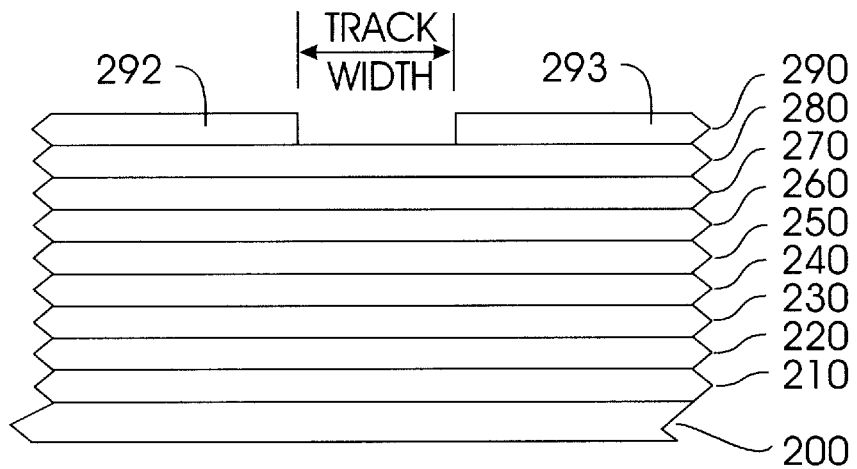

FIGS. 4a–4i illustrate the process to form the sensor structure in FIG. 3. Referring first to FIG. 4a, the sensor layers are deposited and built up sequentially from the substrate 200, beginning with the underlayer 210, antiferromagnetic layer 220, fixed layer 230, spacer layer 240, free layer 250, APC layer 260, bias layer 270, and capping layer 280. In one scheme of fabricating the sensor, a photoresist stencil 300, as shown in FIG. 4b, is next patterned on capping layer 280 to define the active sensor trackwidth. In this case, the photoresist mask stencil is a positive image, i.e., the photoresist covers the area designated as the active sensor track width and is absent in all other areas shown. Next a blanket film of a conductive lead material 290 is deposited, as shown in FIG. 4c. Next in sequence the assembly is immersed into a solvent tank to dissolve and remove the photoresist by a conventional lift-off process, resulting in the formation of the patterned leads 292, 293, as shown in FIG. 4d. The patterned lead structure acts as a mask for the removal of material in the sensor trackwidth region.

Figure 4E:
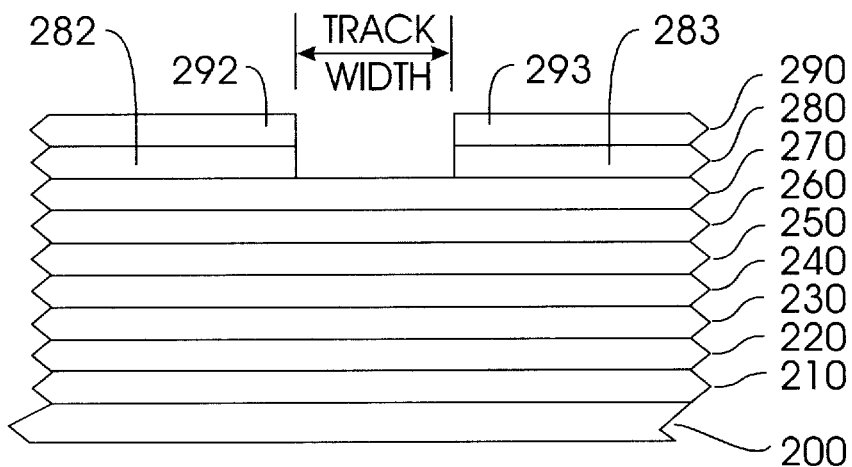
Figure 4F:
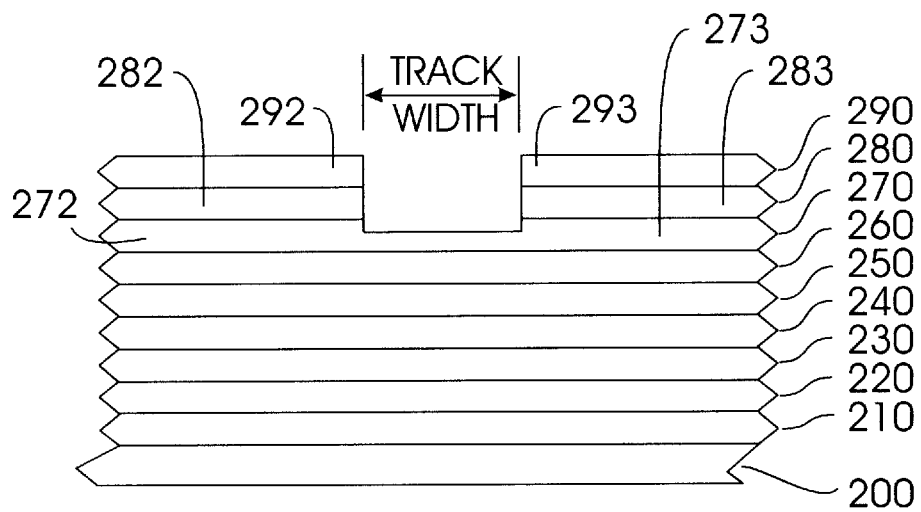

Next the capping layer 280, in the trackwidth region between the lead regions 292, 293, is removed by ion mill, reactive ion etch (RIE), or a combination of the two, depending on the selection of the lead and capping layer materials, leaving capping layer end regions 282, 283. As an example, if the leads are Rh and the cap layer is Ta, then a $CF_4$ and $HCF_3$ reactive plasma may be chosen to selectively remove the Ta capping layer. Alternatively, an ion beam etch may be used to remove the capping layer 280 between the leads 292, 293. The state of the assembly at this point is shown in FIG. 4e. During the ion milling process or RIE process to remove the capping layer 280, some removal of the ferromagnetic bias layer material in the trackwidth region may occur, as shown in FIG. 4f. Next, the region of exposed bias layer over the trackwidth region is oxidized. Complete oxidation of the material in the ferromagnetic bias layer over the trackwidth region renders it nonmagnetic and highly electrically resistive. Because the bias layer end regions 272, 273 are protected by the leads 292, 293 and capping layer end regions 282, 283, the oxidation process leaves the end regions 272, 273 unchanged in ferromagnetic composition and properties. The cross sectional view of the sensor in which the unmasked central bias layer region 274 over the trackwidth region is oxidized is shown in FIG. 4g.

Figure 5A:
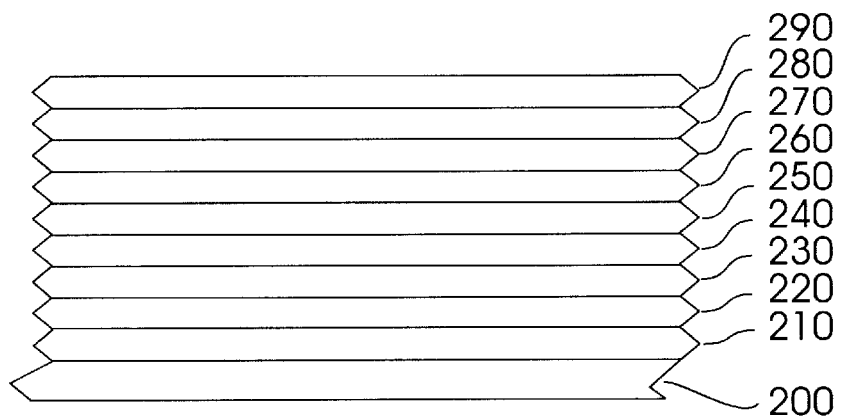
FIGS. 5a–5d are cross sectional views of stages of sensor patterning with an inverse tone mask.
Figure 5B:
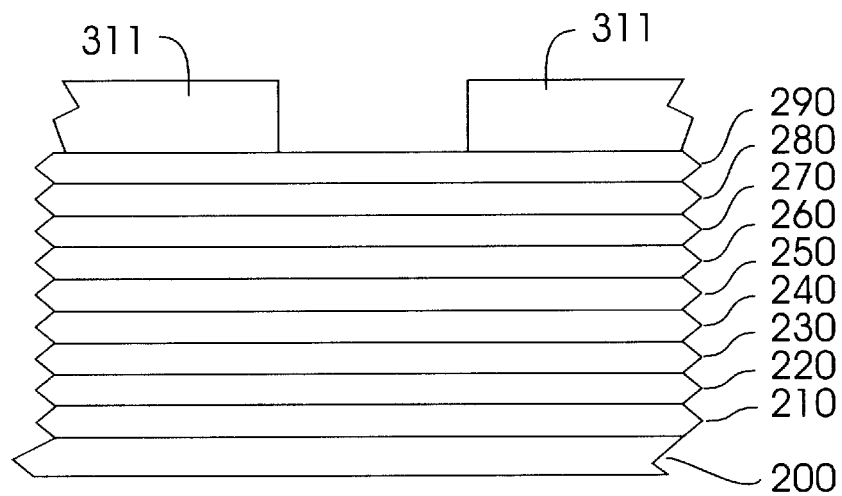
Figure 5C:
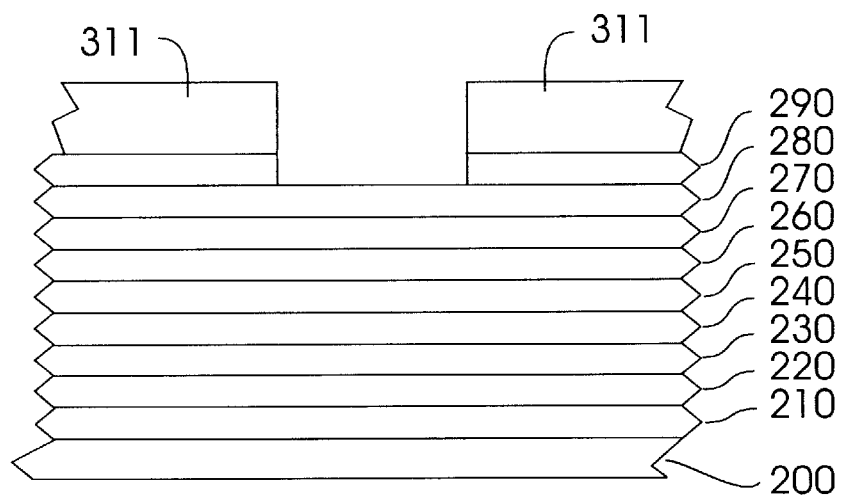
Figure 5D:
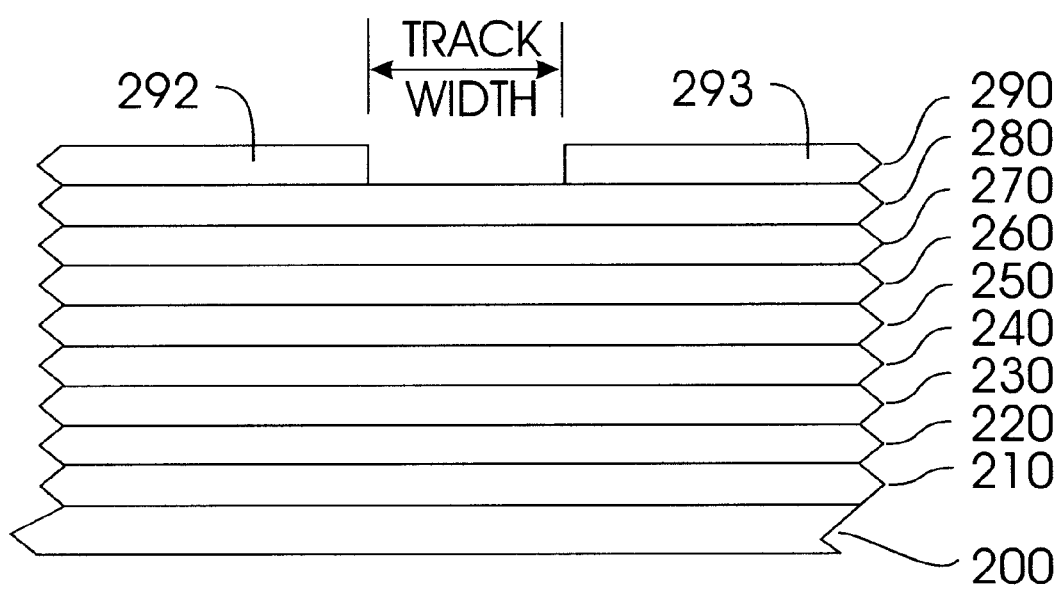

FIGS. 5a–5d illustrate an alternative approach to the steps shown in FIGS. 4a–4d. The lead material 290 is deposited on top of the sensor, as shown in FIG. 5a. A mask 311 is patterned in inverse tone to that shown in FIG. 4b on top of the lead material, as shown in FIG. 5b. Here the mask pattern is transferred to the lead material by a subtractive process such as ion milling, reactive ion etching, or chemical etching, as shown in FIG. 5c. The mask is stripped by a solvent or plasma etch, shown in FIG. 5d.

Figure 4G:
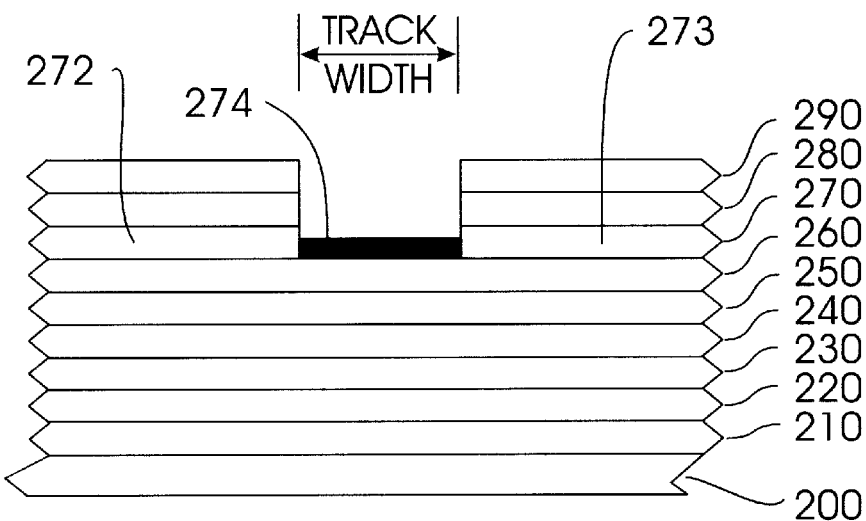
Figure 4H:
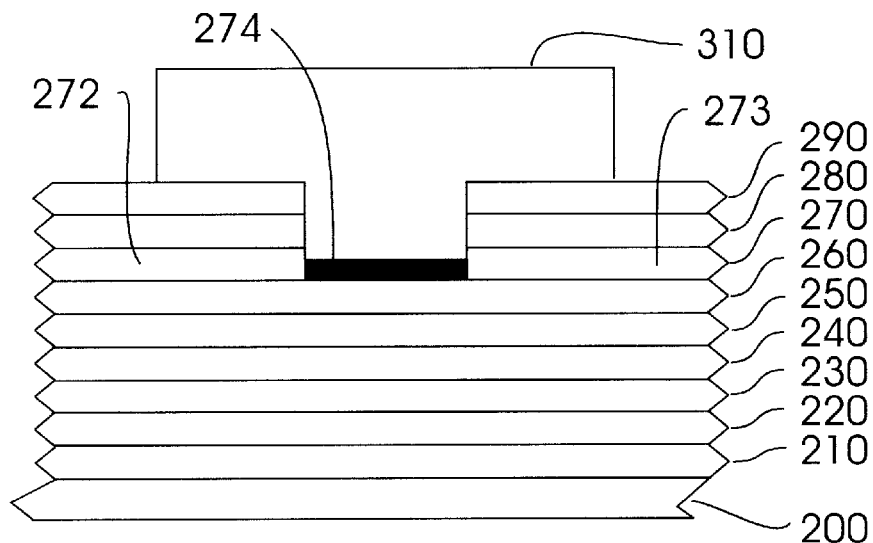
Figure 4I:
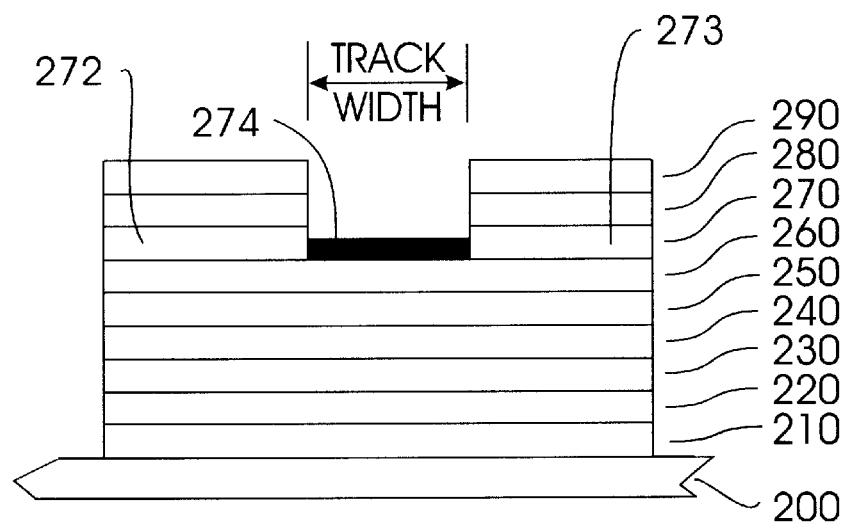

After the structure of FIG. 4d (or FIG. 5d if the alternative approach is followed) is formed, and subsequent oxidation is completed, as shown in FIG. 4g, the formation of the desired outer dimensions of the sensor is performed by conventional means involving formation of a photoresist stencil 310, as shown in FIG. 4h, followed by ion beam etching. The photoresist 310 is then stripped by conventional means (dissolution or RIE), with the resulting sensor shown in FIG. 4i. Alternatively, the outer dimensions can be formed before the lead pattern and/or the bias layer oxidation.

The magnetizations of the bias layer and free layer are then initialized by conventional methods. The magnetic moments of the bias layer end regions 272, 273 spontaneously align antiparallel to the magnetic moments of the corresponding free layer end regions 252, 253 when the initializing magnetic field is applied.

In the present invention, the use of oxidation eliminates the need to precisely remove the bias layer material in the trackwidth region. The problems with the prior art material removal process can be better understood by considering actual material thicknesses and etch process details. For example, a typical capping layer thickness is 5 nm and a typical bias layer thickness is 3 nm. Ion milling rates are typically 0.1 nm/sec, so to precisely remove the cap and the bias layer a milling time of 80 seconds would be required. However, typical thickness uniformity and milling uniformity are of the order of 5% each, so an uncertainty in milling removal of 10% (or 0.8 nm) is possible. Insufficient removal leaves bias layer material in the active trackwidth region. Excess removal will reduce the thickness of the free layer. Furthermore, a low voltage (175 eV) $Ar^+$ mill will leave residual ion damage extending approximately 2 nm beneath the end-point in the underlying free layer. All of these problems degrade free layer sensitivity. By use of the oxidation process of the present invention, only the capping layer must be removed, which results in surface end-point non-uniformity of between 0.15 nm and 0.5 nm, depending on the capping layer material and etch process used. By targeting the total removal of 5 nm cap thickness by designing a 10% overetch, at most only 1 nm of the 3 nm thick bias layer thickness would be removed. Thus a sufficient thickness of bias layer and spacer layer remains to shield the underlying free layer from damage. If the capping layer is a material such as Ta that can be removed by a selective RIB etch, the endpoint error is reduced greatly.

Oxidation processes include ozone treatment, air oxidation, thermal oxidation, plasma oxidation, electrolytic oxidation, implantation of oxygen or molecular oxygen ($O_2$, $O_3$) ions or neutrals. Reactive oxygen plasma induced oxidation can be performed in a RF coupled plasma, electron cyclotron resonance coupled plasma, or an inductively coupled plasma (ICP). A typical process for oxidation of the bias layer is with an ICP plasma tool, which generates a dense plasma of oxygen radicals, and allows the substrate bias to be controlled separately from the plasma source. When etching a test wafer with photoresist, in the ICP system in an oxygen plasma under typical plasma oxidation conditions, the etch rate is uniform across an entire 5 inch wafer to within 3%. The oxidation process that induced demagnetization of a ferromagnetic layer was typically with 30 sccm $O_2$, substrate temperature 20° C., 10 mT chamber pressure, 50 W @13.5 MHz applied to the source coils, and 18 W @13.5 MHz applied to the substrate. It has also been experimentally observed that the gradient between the oxidized, nonmagnetic region and the unoxidized ferromagnetic regions of the bias layer is quite sharp and well defined, making this process especially suitable for forming the active track width of the sensor. Additionally some oxidation occurs in the APC layer 260. The oxidation of a portion of the APC layer affords ample process latitude for complete oxidation of the bias layer 270 (within its central region 274) without oxidation or damage to the underlying free layer 250.

Figure 6:
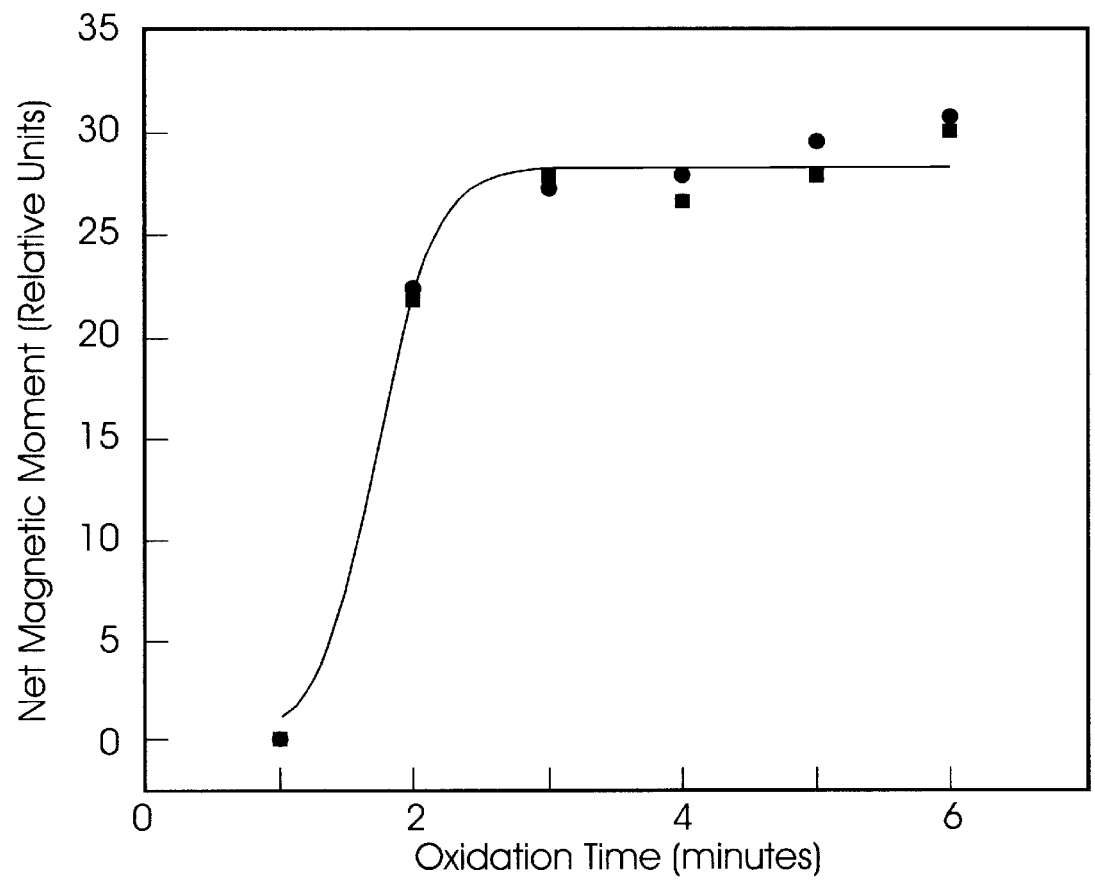
FIG. 6 is a graph of net magnetic moment, in relative units, vs. oxidation time for an antiferromagnetically coupled bias layer and free layer.

FIG. 6 is a graph of the net magnetic moment (in relative units) of a CoFe—NiFe free layer/Ru APC layer/CoFe layer structure vs. oxidation time. Initially the bilayer free layer and the bias layer have the same magnetic moments but with their magnetizations aligned antiparallel, so the net magnetic moment of the structure is zero. As the bias layer becomes oxidized and a portion of it becomes nonmagnetic a net moment is exhibited because the moment of the bias layer becomes less than the moment of the underlying free layer. When the bias layer is fully oxidized and nonmagnetic, the resulting magnetic moment is that of the underlying free layer (CoFe—NiFe).

While the present invention has been particularly shown and described with reference to the preferred embodiments, it will be understood by those skilled in the art that various changes in form and detail may be made without departing from the spirit and scope of the invention. Accordingly, the disclosed invention is to be considered merely as illustrative and limited in scope only as specified in the appended claims.

What is claimed is:

1. A magnetoresistive sensor comprising:
   a substrate;
   a fixed ferromagnetic layer on the substrate, the magnetization of the fixed layer being fixed in a preferred direction;
   an electrically conductive spacer layer on the fixed ferromagnetic layer;
   a free ferromagnetic layer on the spacer layer and having two end regions and a central region between the two end regions;
   an antiparallel coupling layer on each free layer end region;
   a bias ferromagnetic layer on each antiparallel coupling layer for biasing the magnetization of each free layer end region in a direction substantially antiparallel to the magnetization of the bias layer; and
   a nonmagnetic layer on the free layer central region, the nonmagnetic layer being contiguous with each bias layer and being formed of one or more oxides of the same ferromagnetic material present in the bias layers, whereby the magnetization of the free layer central region is substantially free to rotate in the presence of an applied magnetic field, wherein the bias layers are formed of a bilayer of a CoFe alloy and a NiFe alloy, and wherein the nonmagnetic layer is formed of one or more oxides of Co, Ni and Fe.

2. The sensor of claim 1 further comprising first and second electrically conductive leads electrically connected with the free layer.

3. The sensor of claim 1 further comprising an antiferromagnetic layer in contact with the fixed layer and exchange coupled with the fixed layer for pinning the magnetization of the fixed layer in said preferred direction.

4. The sensor of claim 1 wherein the electrically conductive spacer layer is copper.

5. The sensor of claim 1 wherein the antiparallel coupling layer is ruthenium.

6. A magnetoresistive head for sensing data recorded on a magnetic recording disk, the head comprising:
   a substrate;
   an antiferromagnetic layer on the substrate;
   a pinned ferromagnetic layer exchange coupled to the antiferromagnetic layer and having its magnetization oriented in a preferred direction and substantially prevented from rotation in the presence of magnetic fields from the disk;
   an electrically conductive spacer layer on the pinned layer;
   a free ferromagnetic layer on the spacer layer;
   an antiparallel coupling layer on the free layer; and
   a bias layer on the antiparallel coupling layer and having two end regions and a central region between the two end regions, each bias layer end region being formed of ferromagnetic material comprising one or more oxidizable elements and having a magnetization for biasing the magnetization of its underlying free layer end region substantially antiparallel across the antiparallel coupling layer, the bias layer central region being formed of nonmagnetic material comprising oxides of one or more of the same elements present in the bias layer end regions and defining a central sensing region in the underlying free layer, whereby the free layer central sensing region has a magnetization that is substantially free to rotate in the presence of magnetic fields from the disk, wherein the bias layer end regions are formed of a bilayer of a CoFe alloy and a NiFe alloy, and wherein the bias layer central region is formed of one or more oxides of Co, Ni and Fe.

7. The head of claim 6 wherein the electrically conductive spacer layer is copper.

8. The head of claim 6 wherein the antiparallel coupling layer is ruthenium.

9. A method for making a current-in-the-plane spin valve magnetoresistive sensor having pinned and free ferromagnetic layers separated by a nonmagnetic electrically conductive spacer layer, the method comprising:
   depositing on a substrate in succession a layer of antiferromagnetic material, a first layer of ferromagnetic material for the pinned layer, a spacer layer of nonmagnetic electrically conductive material, a second layer of ferromagnetic material for the free layer, a layer of antiferromagnetic coupling material, a third layer of ferromagnetic material for biasing the magnetization of the free layer, and a layer of capping material;
   providing a mask over a central region of the capping layer and underlying layers;
   depositing over the mask and capping layer a layer of electrically conducting material as electrical leads for the sensor;
   removing the mask to leave a central opening between two leads;
   removing the capping layer and a portion of the bias layer through said central opening; and
   oxidizing the remaining portion of bias layer material in the central region to render it nonmagnetic.

10. The method of claim 9 wherein the third layer is formed of an alloy comprising Co and Fe, and wherein the nonmagnetic portion is formed of one or more oxides of Co and Fe.

11. The method of claim 9 wherein the third layer is formed of an alloy comprising Ni and Fe, and wherein the nonmagnetic portion is formed of one or more oxides of Ni and Fe.

12. The method of claim 9 wherein the third layer is formed of an alloy comprising Co, Ni and Fe, and wherein the nonmagnetic portion is formed of one or more oxides of Co, Ni and Fe.

13. A method of claim wherein 9 the third layer is formed of a bilayer of a CoFe alloy and a NiFe alloy, and wherein the nonmagnetic portion is formed of one or more oxides of Co, Ni and Fe.

14. The method of claim 9 wherein the spacer layer is copper.

15. The method of claim 9 wherein the coupling layer is ruthenium.

16. The method of claim 9 wherein said removing the capping layer produces surface end-point non-uniformity of between 0.15 nm and 0.5 nm.

17. The method of claim 9 wherein the thickness of the bias layer portion that is removed is at most 1 nm.

18. The method of claim 9 further comprising applying a magnetic field to initialize magnetizations of the free layer and bias layer material.

19. A method for making a current-in-the-plane spin valve magnetoresistive sensor having pinned and free ferromagnetic layers separated by a nonmagnetic electrically conductive spacer layer, the method comprising:

depositing on a substrate in succession a layer of antiferromagnetic material, a first layer of ferromagnetic material for the pinned layer, a spacer layer of nonmagnetic electrically conductive material, a second layer of ferromagnetic material for the free layer, a layer of antiferromagnetic coupling material, a third layer of ferromagnetic material for biasing the magnetization of the free layer, a layer of capping material, and an electrically conducting layer of lead material;

providing a mask over lead material defining an open central region of the lead material and underlying layers;

removing the lead material in the central track region;

removing the mask to leave a central opening between two leads formed on the lead material;

removing the capping layer and a portion of the bias layer through said central opening; and oxidizing the remaining portion of bias layer material in the central region to render it nonmagnetic.

20. The method of claim 19 wherein the third layer is formed of an alloy comprising Co and Fe, and wherein the nonmagnetic portion is formed of one or more oxides of Co and Fe.

21. The method of claim 19 wherein the third layer is formed of an alloy comprising Ni and Fe, and wherein the nonmagnetic portion is formed of one or more oxides of Ni and Fe.

22. The method of claim 19 wherein the third layer is formed of an alloy comprising Co, Ni and Fe, and wherein the nonmagnetic portion is formed of one or more oxides of Co, Ni and Fe.

23. The method of claim 19 wherein the third layer is formed of a bilayer of a CoFe alloy and a NiFe alloy, and wherein the nonmagnetic portion is formed of one or more oxides of Co, Ni and Fe.

24. The method of claim 19 wherein the spacer layer is copper.

25. The method of claim 19 wherein the coupling layer is ruthenium.

26. The method of claim 19 wherein said removing the capping layer produces surface end-point non-uniformity of between 0.15 nm and 0.5 nm.

27. The method of claim 19 wherein the thickness of the bias layer portion that is removed is at most 1 nm.

28. The method of claim 19 further comprising applying a magnetic field to initialize magnetizations of the free layer and bias layer material.

* * * * *